United States Patent
Yonesaka

(10) Patent No.: US 6,696,712 B1
(45) Date of Patent: Feb. 24, 2004

(54) SEMICUSTOM IC HAVING ADJACENT MACROCELLS

(75) Inventor: Yuki Yonesaka, Chofu (JP)

(73) Assignee: Seiko Epson Corporation, Tokyo (JP)

( * ) Notice: Subject to any disclaimer, the term of this patent is extended or adjusted under 35 U.S.C. 154(b) by 58 days.

(21) Appl. No.: 09/643,135

(22) Filed: Aug. 21, 2000

(51) Int. Cl.⁷ .................... H01L 27/10; H01L 23/52
(52) U.S. Cl. .................. 257/207; 257/211; 257/691
(58) Field of Search ............................ 257/207, 208, 257/211, 691, 700, 758, 760, 920, 776; 438/128, 129, 118, 622, 624

(56) References Cited

U.S. PATENT DOCUMENTS

| | | | | | |
|---|---|---|---|---|---|
| 4,449,205 A | * | 5/1984 | Hoffman | ................ | 365/185.08 |
| 5,261,055 A | * | 11/1993 | Moran et al. | ................ | 710/38 |
| 5,903,019 A | * | 5/1999 | Watanabe | ................ | 257/208 |
| 5,949,098 A | * | 9/1999 | Mori | ................ | 257/211 |

FOREIGN PATENT DOCUMENTS

JP 6-69454 * 3/1994

* cited by examiner

*Primary Examiner*—Tom Thomas
*Assistant Examiner*—Hung Kim Vu
(74) *Attorney, Agent, or Firm*—Hogan & Hartson, LLP

(57) ABSTRACT

A semicustom IC including a plurality of basic cells disposed on a semiconductor substrate, a first macrocell, a second macrocell adjacent to the first macrocell, and a power supply line. The first macrocell and the second macrocell are each formed using at least one basic cell and a plurality of interconnection layers. The first macrocell is formed using first basic cells of the plurality of basic cells and using interconnection layers disposed over the first basic cells. The power supply line is for supplying power to the first macrocell and is formed around the first macrocell using an upper interconnection layer of the plurality of interconnection layers. The second macrocell is formed below the power supply line using a basic cell and a lower interconnection layer, extending over the basic cell, of the plurality of interconnection layers.

6 Claims, 7 Drawing Sheets

SEMICUSTOM IC HAVING ADJACENT MACROCELLS

TECHNICAL FIELD

The present invention relates to a semicustom IC such as a gate array and a standard cell.

BACKGROUND ART

FIGS. 6 and 7 illustrate one conventional semicustom IC, wherein FIG. 6 is a plan view and FIG. 7 is a cross-sectional view thereof taken along line B—B.

As shown in FIGS. 6 and 7, the semicustom IC includes a plurality of basic cells 3a, 3b, . . . , 3n which are densely disposed side by side on a semiconductor substrate 1, wherein a first macrocell 2a is formed using basic cells 3c and 3d and also using interconnection lines in two interconnection layers, a first interconnection layer 7 and a second interconnection layer 9, extending over the basic cells 3c and 3d.

Furthermore, in this semicustom IC, as shown in FIGS. 6 and 7, ring-shaped power supply lines 4 and 5 for supplying a specific voltage to the first macrocell 2a are formed using interconnection lines in the first interconnection layer 7 and the second interconnection layer 9 extending around the first macrocell 2a.

In this semicustom IC, as shown in FIGS. 6 and 7, a second macrocell 2b is formed using the basic cell 3a located outside the power supply lines 4 and 5 and also using interconnection lines in the first interconnection layer 7 and the second interconnection layer 9, extending over the basic cell 3a.

The semicustom IC is described in further detail below. As shown in FIG. 7, an insulating layer 6 is formed on the semiconductor substrate 1 on which the plurality of basic cells 3a, 3b, . . . , 3n are formed. On the insulating layer 6, an interconnection conductor 71 used as a signal interconnection line for the first macrocell 2a is formed in the first interconnection layer 7, and an interconnection conductor 72 used as a signal interconnection line for the second macrocell 2b is formed in the first interconnection layer 7.

In the first macrocell 2a, the basic cells 3c and 3d are electrically connected to the interconnection conductor 71 via connecting conductors (through-hole) 74 extending in the thickness direction through the insulating layer 6. In the second macrocell 2b, the basic cell 3a is electrically connected to the interconnection conductor 72 via connecting conductors 75 extending in the thickness direction through the insulating layer 6.

An insulating layer 8 is formed on the first interconnection layer 7 as shown in FIG. 7. On the insulating layer 8, an interconnection conductor 91 used as a signal interconnection line for the first macrocell 2a is formed in the second interconnection layer 9, and an interconnection conductor 92 used as a signal interconnection line for the second macrocell 2b is formed in the second interconnection layer 9. The interconnection conductor 71 and the interconnection conductor 91 are electrically connected to each other via connecting conductors 94 extending in the thickness direction through the insulating layer 8. Similarly, the interconnection conductor 72 and the interconnection conductor 92 are electrically connected to each other via connecting conductors 95 extending in the thickness direction through the insulating layer 8.

In the conventional semicustom IC constructed in the above-described manner, the first macrocell 2a is formed so as to have a desired function using basic cells 3c and 3d formed on the semiconductor substrate 1 and also using the interconnection conductor 71 in the first interconnection layer 7 and the interconnection conductor 91 in the second interconnection layer 9. Similarly, the second macrocell 2b is formed so as to have a desired function using the basic cell 3a formed on the semiconductor substrate 1 and also using the interconnection conductor 72 in the first interconnection layer 7 and the interconnection conductor 92 in the second interconnection layer 9.

The detailed structures of the power supply lines 4 and 5 are described below with reference to FIGS. 6 and 7.

The power supply line 4 includes an interconnection conductor 41, in the first interconnection layer 7, extending horizontally (in FIG. 6) on the insulating layer 6 and also includes an interconnection conductor 42, in the second interconnection layer 9, extending vertically (in FIG. 6) on the insulating layer 8, wherein the interconnection conductor 41 and the interconnection conductor 42 are connected to each other via a connecting conductor 43 extending in the thickness direction through the insulating layer 8 such that a closed circuit is formed. Similarly, the power supply line 5 includes an interconnection conductor 51, in the first interconnection layer 7, extending horizontally on the insulating layer 6 and also includes an interconnection conductor 52, in the second interconnection layer 9, extending vertically on the insulating layer 8, wherein the interconnection conductor 51 and the interconnection conductor 52 are connected to each other via a connecting conductor 53 extending in the thickness direction through the insulating layer 8 such that a closed circuit is formed.

The first macrocell 2a forms, for example, a memory, and the second macrocell 2b located outside the power supply lines 4 and 5 forms, for example, a battery backup circuit for holding data stored in the memory.

In the case where the memory is formed in the first macrocell 2a of the conventional semicustom IC described above, the battery backup circuit is formed in the second macrocell 2b using the basic cell 3a located outside the power supply lines 4 and 5.

However, in this case, because the second macrocell 2b is formed outside the power supply lines 4 and 5, the space needed to form the second macrocell 2b results in an increase in the total size.

The above problem may be avoided if the basic cell 3b, which is located closest to the first macro cell 2a as shown in FIG. 7, can be used. However, the power supply lines 4 and 5 extending directly above the basic cell 3b make it impossible to use the basic cell 3b for such a purpose.

Aspects of the present invention to provide a semicustom IC which includes a large number of basic cells formed on a semiconductor substrate and which allows a plurality of macro cells to be formed using basic cells in an efficient manner thereby allowing a reduction in the total size of the semicustom IC. The present invention provides a semicustom IC including a plurality of basic cells disposed on a semiconductor substrate, a first macrocell, a second macrocell adjacent to the first macrocell, and a power supply line The first macrocell and second macrocell are each formed using at least one basic cell and a plurality of interconnection layers. The first macrocell is formed using first basic cells of the plurality of basic cells and using interconnection layers disposed over the first basic cells. The power supply line is for supplying power to the first macrocell, and is formed around the first macrocell using an upper interconnection layer of the plurality of interconnection layers. The second macrocell is formed below the power supply line using a basic cell and a lower interconnection layer, extending over the basic cell, of the plurality of interconnection layers.

In other embodiments, the interconnection layers can include three or more interconnection layers.

Because the second macrocell can be formed using the basic cell at the location closest to the first macrocell, the basic cells can be used in an efficient manner, and the total size can be reduced.

In other embodiments, the plurality of interconnection layers can include a total of four interconnection layers and the power supply line is formed using a third interconnection layer and a fourth interconnection layer of the total of four interconnection layers.

In other embodiments, the third and fourth interconnection layers of the total of four interconnection layers can be used to form the power supply line for the first macrocell, and the remaining first and second interconnection layers can be used as interconnection layers for the second macrocell. This allows the second macrocell to be used to form a circuit having a relatively large circuit scale.

In other embodiments, the second macrocell can be an interface circuit disposed between a circuit formed in the first macrocell and another circuit.

This makes it possible to realize a semicustom IC including an interface circuit and reduce the total size of the semicustom IC.

In other embodiments, the first macrocell can form a memory and the second macrocell can form a battery backup circuit for maintaining the content of the memory.

This allows a memory and a battery backup circuit for the memory to be realized using the semicustom IC with a reduced total size.

In other embodiments, the power supply line can partially overlap the first macrocell.

In other embodiments, the interconnection layers can include three or more interconnection layers.

Because a macrocell can be formed using a basic cell at the location closest to the macrocell surrounded by the power supply line, the basic cells can be used in an efficient maimer, and the total size can be reduced.

In other embodiments, the power supply line can be formed such that the power supply line is used in common by at least two macrocells of the plurality of macrocells.

Because the power supply line includes a part which is used in common, the total length of the power supply line is reduced.

In other embodiments, the interconnection layers can include a total of four interconnection layers and the power supply line can be formed using a third interconnection layer and a fourth interconnection layer of the total of four interconnection layers.

The third and fourth interconnection layers of the total of four interconnection layers can be used to form the power supply line, and the remaining first and second interconnection layers can be used as interconnection layers for the macrocell. This allows the macrocell to be used to form a circuit having a relatively large circuit scale.

Aspects of the present invention can also provide a semicustom IC including a plurality of basic cells disposed on a semiconductor substrate, a plurality of macrocells formed using the plurality of basic cells and a plurality of interconnection layers, a first power supply line, and a second power supply line. At least two macrocells of the plurality of macrocells are formed using particular basic cells of the plurality of basic cells and using at least one interconnection layer of the plurality of interconnection layers disposed over the particular basic cells. The first power supply line is for supplying power to one macrocell of the at least two macrocells, and is formed around the one macrocell using an upper interconnection layer of the plurality of interconnection layers. The second power supply line is for supplying power to another macrocell of the at least two macrocells, and is formed around the another macrocell using the upper interconnection layer of the plurality of interconnection layers. The remaining macrocells of the plurality of macrocells are formed using basic cells located below at least one of the first power supply line and the second power supply line and also using a lower interconnection layer of the plurality of interconnection layers .

In other embodiments, the interconnection layers can include three or more interconnection layers.

Because the remaining macrocells of the plurality of macrocells can be formed using the plurality of basic cells at the location closest to the at least two macrocells, the basic cells can be used in an efficient manner, and the total size can be reduced.

In other embodiments, the plurality of interconnection layers can include a total of four interconnection layers and the first power supply line and the second power supply line are formed using a third interconnection layer and a fourth interconnection layer of the total of four interconnection layers.

The third and fourth interconnection layers of the total of four interconnection layers can be used to form the first power supply line for the one macrocell and the second power supply line for the another macrocell. The remaining first and second interconnection layers can be used as interconnection layers for the remaining macrocells of the plurality of macrocells. This allows the remaining macrocells to be used to form a circuit having a relatively large circuit scale.

In other embodiments, the remaining macrocells of the plurality of macrocells can be interface circuits disposed between circuits formed in the at least two macrocells and other circuits.

This makes it possible to realize a semicustom IC including interface circuits and reduce the total size of the semicustom IC.

In other embodiments, the at least two macrocells form memories and the remaining macrocells form battery backup circuits for maintaining the content of the memory.

This can allow memories and battery backup circuits for the memories to be realized using the semicustom IC with a reduced total size.

In other embodiments, the first power supply line and the second power supply line are formed such that the first power supply line and the second power supply line are used in common by more than one macrocell of the plurality of macrocells.

Because the first and second power supply lines include a portion which is used in common, the total length of the first and second power supply lines is reduced.

DETAILED DESCRIPTION OF THE INVENTION

Embodiments of the present invention are described below with reference to figures.

Figure 1:
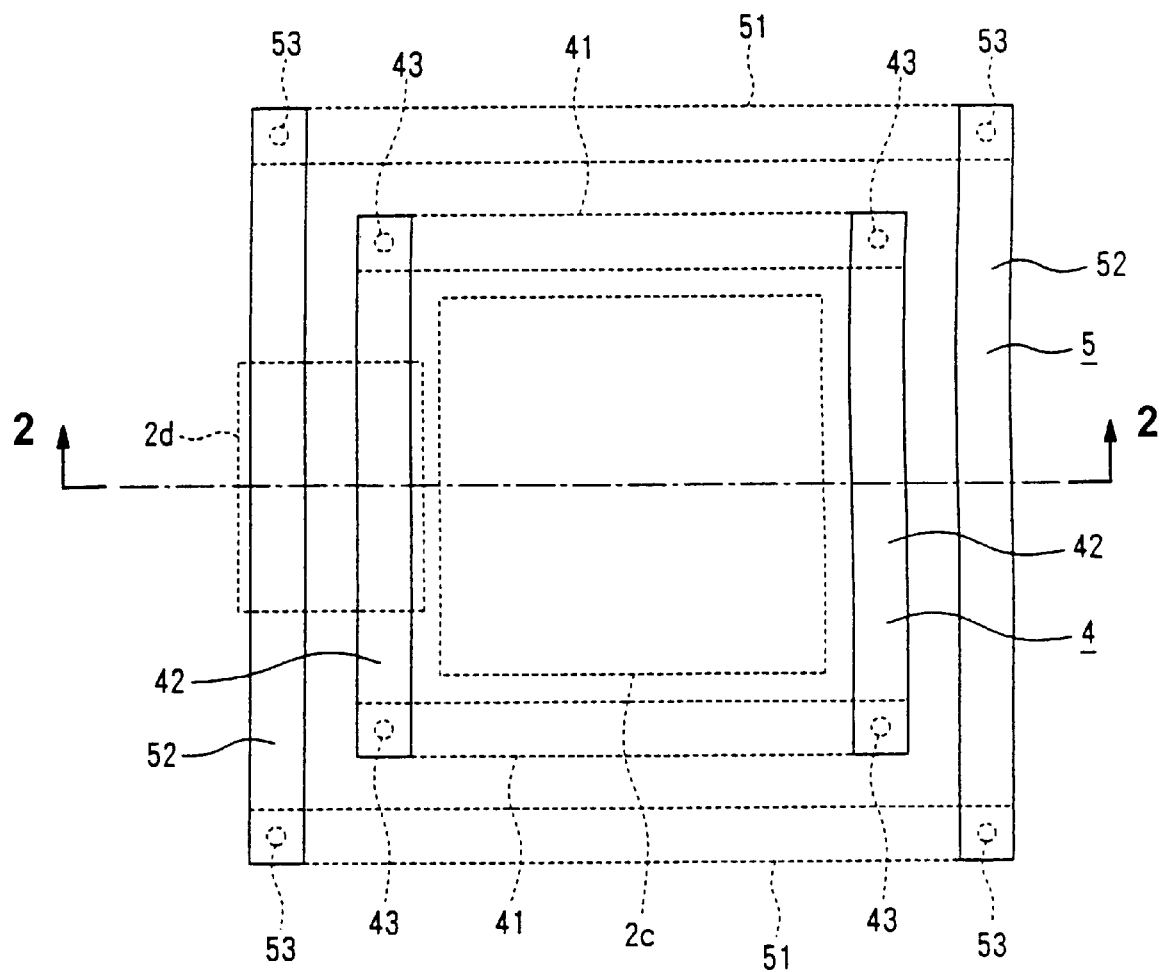
FIG. 1 is a plan view of an embodiment of a semicustom IC according to the present invention.
Figure 2:
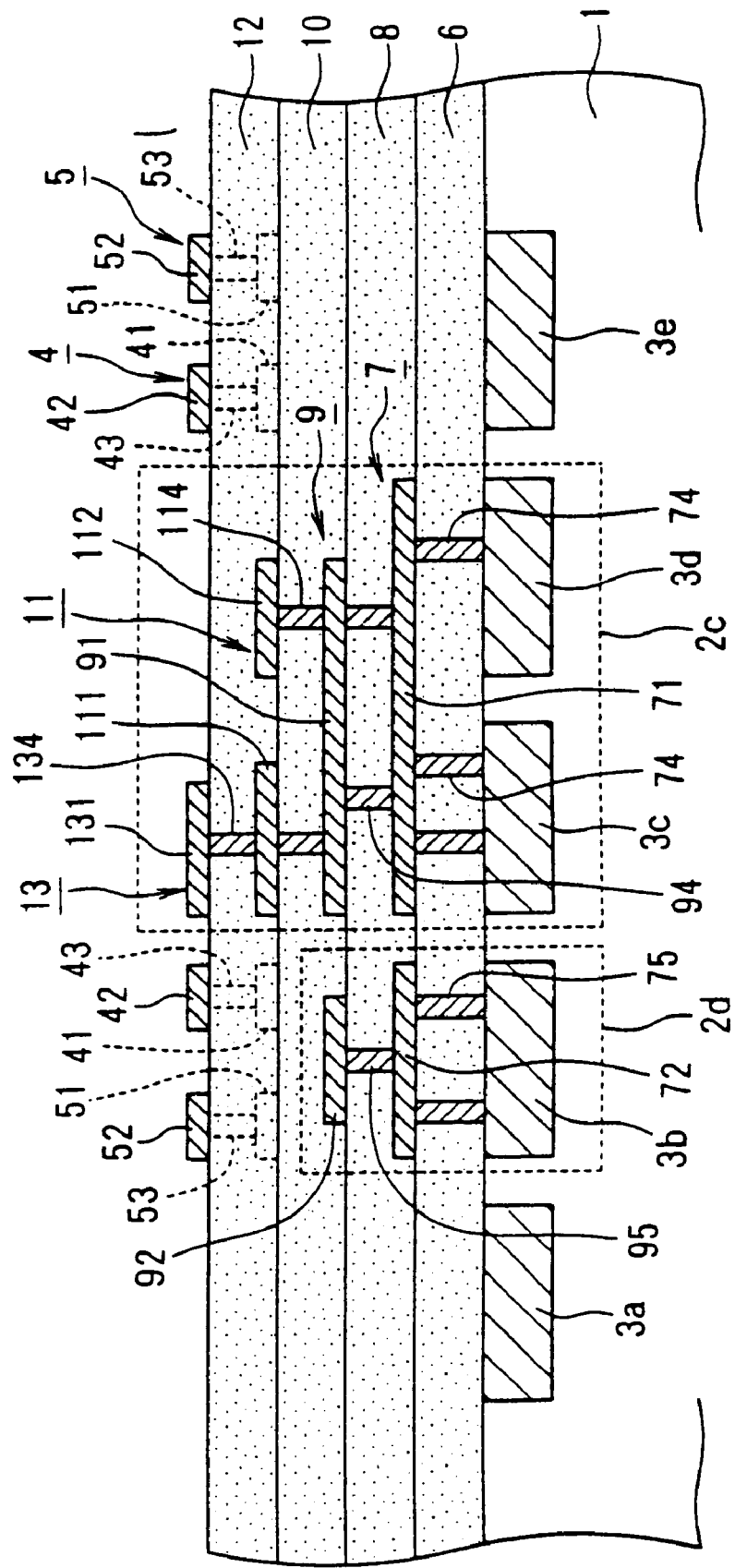
FIG. 2 is a cross-sectional view taken along line A—A of FIG. 1.

FIG. 1 is a plan view of a first embodiment of a semicustom IC according to the present invention. FIG. 2 is a cross-sectional view taken along line A—A of FIG. 1.

As shown in FIGS. 1 and 2, the first embodiment of the semicustom IC includes a plurality of basic cells $3a$, $3b$, . . . , $3n$ which are densely disposed side by side on a semiconductor substrate 1, wherein a first macrocell $2c$ is formed using basic cells $3c$ and $3d$ and also using interconnection lines in four interconnection layers, that is, first to fourth interconnection layers 7, 9, 11, and 13, extending over the basic cells $3c$ and $3d$.

Furthermore, in this first embodiment of the semicustom IC, as shown in FIGS. 1 and 2, ring-shaped power supply lines 4 and 5 with a specific width and thickness for supplying a specific voltage to the first macrocell $2c$ are formed using interconnection lines in the third interconnection layer 11 and the fourth interconnection layer 13 extending around the first macrocell $2c$.

Furthermore, in this first embodiment of the semicustom IC, as shown in FIGS. 1 and 2, a second macrocell $2d$ is formed using a basic cell $3b$ located below the power supply lines 4 and 5 and closest to the first macrocell $2c$ and also using interconnection lines in the first and second interconnection layers 7 and 9, extending over the basic cell $3b$.

Herein, the first macrocell $2c$ and the second macrocell $2d$ have a particular relationship with each other. For example, the first macrocell $2c$ forms a memory and the second macrocell $2d$ forms a battery backup circuit for holding data stored in the memory.

The first embodiment of the semicustom IC is described in further detail below. As shown in FIG. 1, an insulating layer 6 is formed on the semiconductor substrate 1 on which the plurality of basic cells $3a$, $3b$, . . . , $3n$ are formed. On the insulating layer 6, an interconnection conductor 71 used as a signal interconnection line for the first macrocell $2c$ is formed in the first interconnection layer 7, and an interconnection conductor 72 used as a signal interconnection line for the second macrocell $2d$ is formed in the first interconnection layer 7.

In the first macrocell $2c$, the basic cells $3c$ and $3d$ are electrically connected to the interconnection conductor 71 via connecting conductors (through-hole) 74 extending in the thickness direction through the insulating layer 6. In the second macrocell $2d$, the basic cell $3b$ is electrically connected to the interconnection conductor 72 via connecting conductors 75 extending in the thickness direction through the insulating layer 6.

An insulating layer 8 is formed on the first interconnection layer 7 as shown in FIG. 2. On the insulating layer 8, an interconnection conductor 91 used as a signal interconnection line for the first macrocell $2c$ is formed in the second interconnection layer 9, and an interconnection conductor 92 used as a signal interconnection line for the second macrocell $2d$ is formed in the second interconnection layer 9. The interconnection conductor 71 and the interconnection conductor 91 are electrically connected to each other via connecting conductors 94 extending in the thickness direction through the insulating layer 8. The interconnection conductor 72 and the interconnection conductor 92 are electrically connected to each other via connecting conductors 95 extending in the thickness direction through the insulating layer 8.

An insulating layer 10 is formed on the second interconnection layer 9 as shown in FIG. 2. On the insulating layer 10, interconnection conductors 111 and 112 used as signal interconnection lines for the first macrocell $2c$ are formed in the third interconnection layer 11. The interconnection conductor 91 and the interconnection conductors 111 and 112 are electrically connected to each other via connecting conductors 114 extending in the thickness direction through the insulating layer 10.

Furthermore, an insulating layer 12 is formed on the third interconnection layer 11 as shown in FIG. 2. On the insulating layer 12, an interconnection conductor 131 used as a signal interconnection line for the first macrocell $2c$ are formed in the fourth interconnection layer 13. The interconnection conductor 111 and the interconnection conductor 131 are electrically connected to each other via connecting conductors 134 extending in the thickness direction through the insulating layer 12.

In this first embodiment constructed in the above-described manner, the first macrocell $2c$ is formed to have a desired function using basic cells $3c$ and $3d$ formed on the semiconductor substrate 1 and interconnection conductors 71, 91, 111, and 131 in the respective interconnection layers 7, 9, 11, and 13. Similarly, the second macrocell $2d$ is formed to have a desired function using the basic cell $3b$ formed on the semiconductor substrate 1 and interconnection conductors 72 and 92 in the respective interconnection layers 7 and 9.

The detailed structures of the power supply lines 4 and 5 are described below with reference to FIGS. 1 and 2.

The power supply line 4 includes an interconnection conductor 41, in the third interconnection layer 11, extending horizontally (in FIG. 1) on the insulating layer 10 and also includes an interconnection conductor 42, in the fourth interconnection layer 13, extending vertically (in FIG. 1) on the insulating layer 12, wherein the interconnection conductor 41 and the interconnection conductor 42 are connected to each other via a connecting conductor 43 extending in the thickness direction through the insulating layer 12 such that a closed circuit is formed. Similarly, the power supply line 5 includes an interconnection conductor 51, in the third interconnection layer 11, extending horizontally on the insulating layer 10 and also includes an interconnection conductor 52 extending vertically on the insulating layer 12, wherein the interconnection conductor 51 and the interconnection conductor 52 are connected to each other via a connecting conductor 53 extending in the thickness direction through the insulating layer 12 such that a closed circuit is formed.

For example, the power supply line 4 is used for connection with a power supply, and the power supply line 5 is used as a ground line.

In this first embodiment of the semicustom IC, as described above, the power supply lines 4 and 5 for supplying the voltage to the first macrocell $2c$ are formed around the first macrocell 2c using the third interconnection layer 11 and the fourth interconnection layer 13, and the second macrocell 2d is formed using the basic cell 3b located below the power supply lines 4 and 5 and closest to the first macrocell 2c and also using the first interconnection layer 7 and the second interconnection layer 9 extending over the basic cell 3b. This allows the basic cell 3b at the location closest to the first macrocell 2c to be used to form a circuit such as a battery backup circuit, and thus it is possible to reduce the total size.

Furthermore, in this first embodiment of the semicustom IC, the first macrocell 2c and the second macrocell 2d can be formed at locations closer to each other than in the conventional semicustom IC, and thus it is possible to reduce the lengths of interconnection lines between them. This allows a signal to be transmitted with less propagation delay between the first macrocell 2c and the second macrocell 2d, and thus the semicustom IC can operate at a high speed. Furthermore, the reduction in the propagation delay makes it easier to handle signals with correct timing. The above-described advantages can be obtained not only in the case where there are two macrocells but also in the case where there are three or more macrocells, and the advantages become greater with the increase in the number of macrocells.

In the first embodiment, the power supply lines 4 and 5 are formed using the third and fourth interconnection layers 11 and 13 such that each power supply line is closed. Alternatively, the power supply lines 4 and 5 may be formed using one of the third and fourth interconnection lines 11 and 13, and the closed circuit may be open at a particular part.

Furthermore, although in this first embodiment, the first macrocell 2c is used to form the memory, and the second macrocell 2d, which is formed using the basic cell 3b at the location closest to the first macrocell 2c, is used to form the battery backup circuit for the memory, the first macrocell 2c may also be used to form another type of circuit other than the memory, such as a CPU or DSP, and the second macrocell 2d may preferably be used to form an interface circuit for electrically connecting the circuit formed in the first macrocell 2c to another circuit.

In the case where a CPU is formed using the first macrocell 2c, various types of analog circuits or memory may be formed as another circuit described above. In this case, the second macrocell 2d may be an interface circuit for transmitting and receiving a signal to and from various analog circuits (or memory).

Furthermore, although in this first embodiment, the power supply lines 4 and 5 are formed such that there is no overlap between the power supply lines and the first macrocell 2c when seen in the thickness direction, they may be partially overlapped.

Although in the first embodiment, the total of four interconnection layers are provided and the power supply lines 4 and 5 are formed using the third interconnection layer 11 and the fourth interconnection layer 13, the total number of the interconnection layers may be three or any number greater than four (for example, five or six).

In the case where a total of three interconnection layers are provided, the first interconnection layer 7, for example, may be used for the second macrocell 2d, and the second and third interconnection layers 9 and 11 may be used for the power supply lines 4 and 5. In this case, a smaller number of interconnection layers are available for use by the second macrocell 2d, compared with the case where a total of four interconnection layers are provided. However, no problem occurs if the circuit scale of the second macrocell 2d is small.

In the case where a total of five interconnection layers are provided, first to third interconnection layers 7, 9, and 11, for example, may be used for the second macrocell 2d, and the fourth interconnection layer 13 and the fifth interconnection layer (not shown) may be used for the power supply lines 4 and 5. In this case, a greater number of interconnection layers are available for use by the second macrocell 2d compared with the case where a total of four interconnection layers are provided. This is advantageous when the circuit scale of the second macrocell 2d is rather large.

In the first embodiment, as shown in FIG. 2, the second macrocell 2d is formed using the basic cell 3b located below the power supply lines 4 and 5 and also using the first interconnection layer 7 and the second interconnection layer 9 extending over the basic cell 3b. Below the power supply lines 4 and 5, other basic cells such as 3e are also formed in addition to the basic cell 3b. Therefore, in another embodiment, a third macrocell (not shown) may be formed, in addition to the second macrocell 2d, using the basic cell 3e and the first interconnection layer 7 and the second interconnection layer 9 extending over the basic cell.

Figure 3:
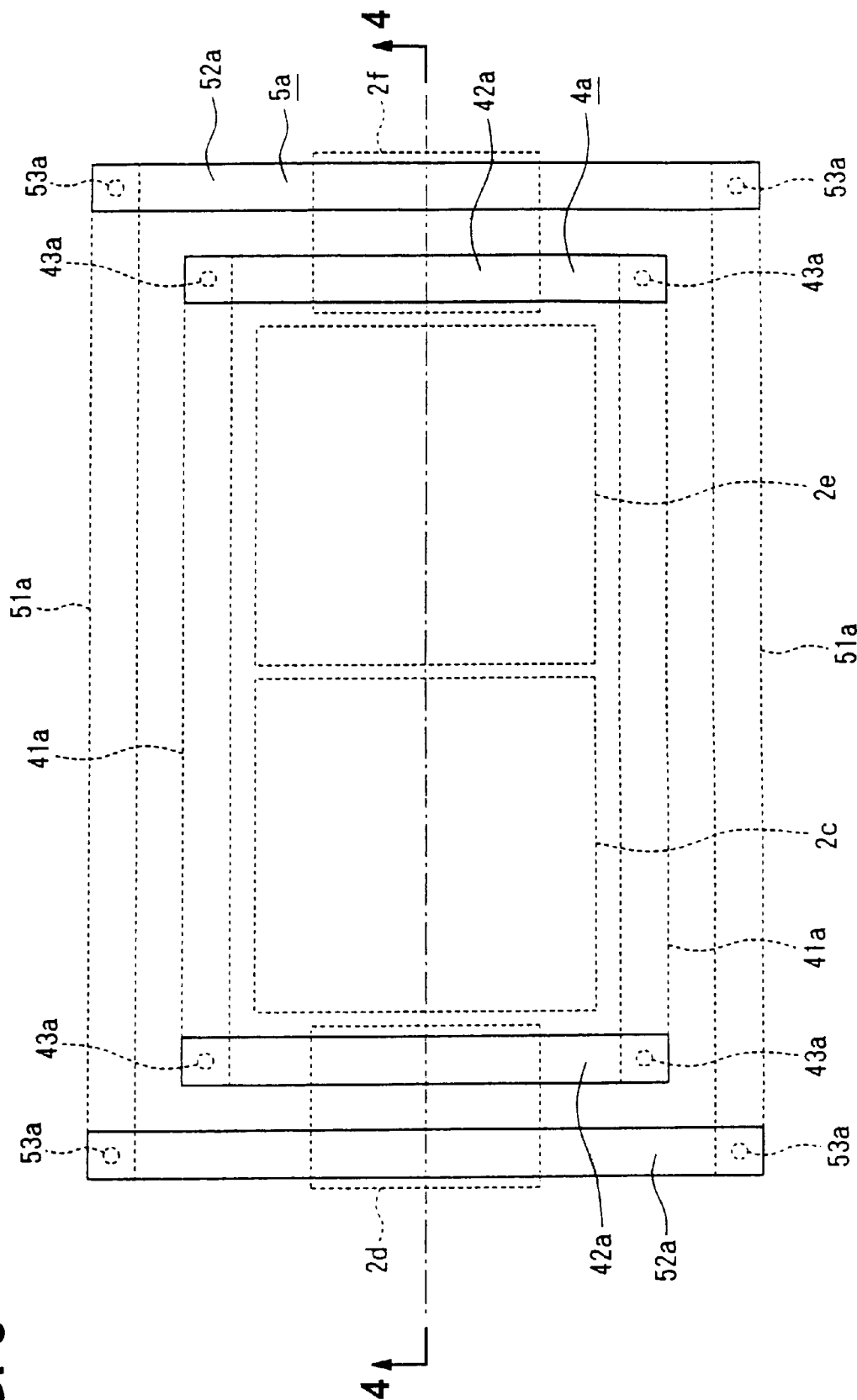
FIG. 3 is plan view of a second embodiment of a semicustom IC according to the present invention.

A second embodiment of a semicustom IC according to the present invention is described below with reference to FIGS. 3 and 4. FIG. 3 is a plan view of the second embodiment, and FIG. 4 is a cross-sectional view thereof, taken along line C—C of FIG. 3.

Figure 4:
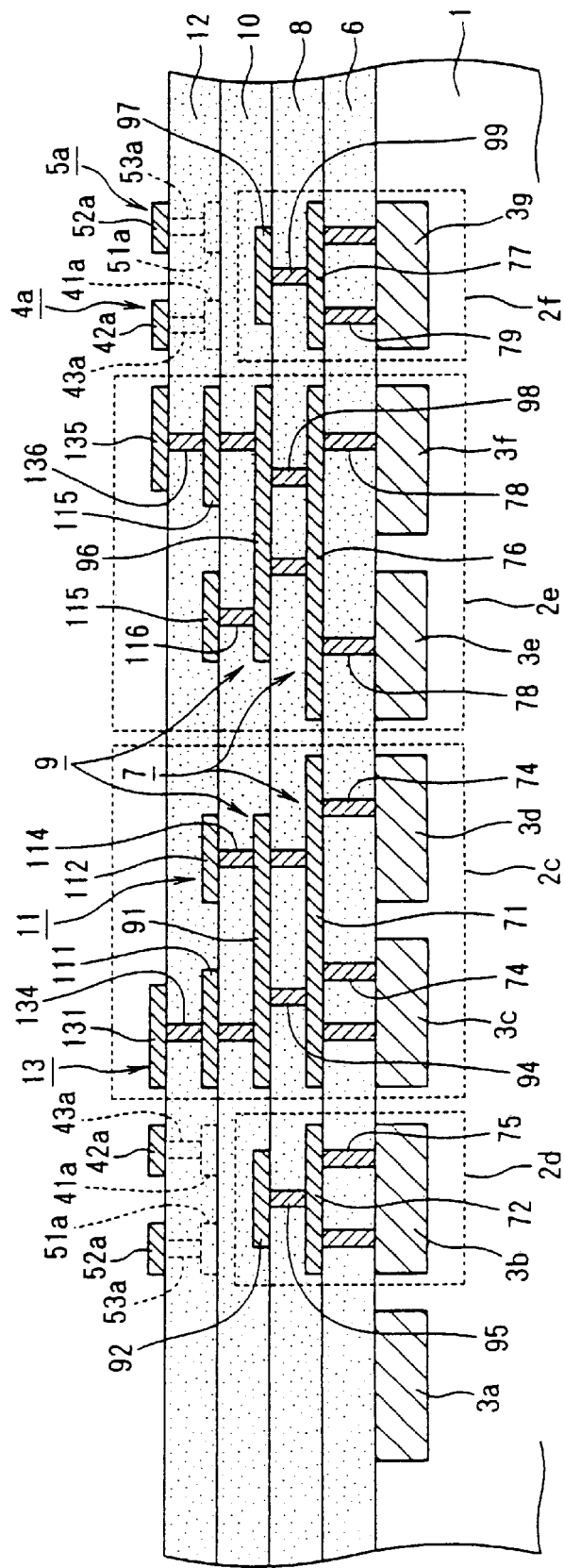
FIG. 4 is a cross-sectional view taken along line C—C of FIG. 3.

As shown in FIGS. 3 and 4, the second embodiment of the semicustom IC further includes, in addition to the first macrocell 2c and the second macrocell 2d in the first embodiment, a third macrocell 2e and a fourth macrocell 2f.

Furthermore, in this second embodiment of the semicustom IC, as shown in FIGS. 3 and 4, ring-shaped power supply lines 4a and 5a with a specific width and thickness for supplying a specific voltage to the first macrocell 2c and the third macrocell 2e are formed using interconnection lines in the third interconnection layer 11 and the fourth interconnection layer 13 extending around the first macrocell 2c and the second macrocell 2e, such that the power supply lines 4a and 5a are used in common by the macrocells 2c and 2e.

In this second embodiment, similar parts to those in the first embodiment are denoted by similar reference numerals and they are not described in further detail herein. Only those parts different from the first embodiment are described below.

The third macrocell 2e is formed using the basic cells 3e and 3f and interconnection lines in four interconnection layers, that is, the first to fourth interconnection layers 7, 9, 11, and 13.

More specifically, the basic cells 3e and 3f formed on the semiconductor substrate 1 are electrically connected to an interconnection conductor 76 in the first interconnection layer 7 via connecting conductors 78 extending in the thickness direction through an insulating layer 6. An interconnection conductor 76 in the first interconnection layer 7 and an interconnection conductor 96 in the second interconnection layer 9 are electrically connected to each other via connecting conductors 98 extending in the thickness direction through an insulating layer 8. Furthermore, the interconnection conductor 96 in the second interconnection layer 9 and interconnection conductors 115 in the third interconnection layer 11 are electrically connected to each other via connecting conductors 116 extending in the thickness direction through an insulating layer 10. The interconnection conductors 115 in the third interconnection layer 11 and an interconnection conductor 135 in the fourth interconnection layer 13 are electrically connected to each other via a connecting conductor 136 extending in the thickness direction through the insulating layer 12.

The third macrocell 2f is formed using a basic cell 3g and interconnection lines in two interconnection layers, that is, the first and second interconnection layers 7 and 9.

More specifically, the basic cell 3g formed on the semiconductor substrate 1 is electrically connected to an interconnection conductor 77 in the first interconnection layer 7 via connecting conductors 79 extending in the thickness direction through the insulating layer 6. The interconnection conductor 77 in the first interconnection layer 7 and the interconnection conductor 97 in the second interconnection layer 9 are electrically connected to each other via a connecting conductor 99 extending in the thickness direction through the insulating layer 8.

The detailed structures of the power supply lines 4a and 5a are described below with reference to FIGS. 3 and 4.

The power supply line 4a includes an interconnection conductor 41a, in the third interconnection layer 11, extending horizontally (in FIG. 3) on the insulating layer 10 and also includes an interconnection conductor 42a, in the fourth interconnection layer 13, extending vertically (in FIG. 3) on the insulating layer 12, wherein the interconnection conductor 41a and the interconnection conductor 42a are connected to each other via a connecting conductor 43a extending in the thickness direction through the insulating layer 12 such that a closed circuit is formed. Similarly, the power supply line 5a includes an interconnection conductor 51a, in the third interconnection layer 11, extending horizontally on the insulating layer 10 and also includes an interconnection conductor 52a extending vertically on the insulating layer 12, wherein the interconnection conductor 51a and the interconnection conductor 52a are connected to each other via a connecting conductor 53a extending in the thickness direction through the insulating layer 12 such that a closed circuit is formed.

In this second embodiment of the semicustom IC, as described above, the common power supply lines 4a and 5a for supplying the voltage to the first and third macrocells 2c and 2e are formed, around the macrocells 2c and 2e, using the third interconnection layer 11 and the fourth interconnection layer 13. The second macrocell 2d and the fourth macrocell 2f are formed using the basic cells 3b and 3g located below the power supply lines 4a and 5a closest to the first and third macrocells 2c and 2e, and also using the first interconnection layer 7 and the second interconnection layer 9 extending over the basic cells 3b and 3g. This makes it possible to use the basic cells 3b and 3b in an efficient manner and thus reduce the total size.

Furthermore, in this second embodiment of the semicustom IC, the distance between the first macrocell 2c and the second macrocell 2d and the distance between the third macrocell 2e and the fourth macrocell 2f can be reduced, and thus it is possible to reduce the lengths of interconnection lines between them. This allows signals to be transmitted with less propagation delay between the first macrocell 2c and the second macrocell 2d and between the third macrocell 2e and the fourth macrocell 2f, and thus the semicustom IC can operate at a high speed. Furthermore, the reduction in the propagation delay makes it easier to handle signals with correct timing.

Furthermore, in this second embodiment of the semicustom IC, the use of the common power supply lines 4a and 5a for supplying the voltage to the first and third macrocells 2c and 2e results in a reduction in the total length of the power supply lines.

Figure 5:
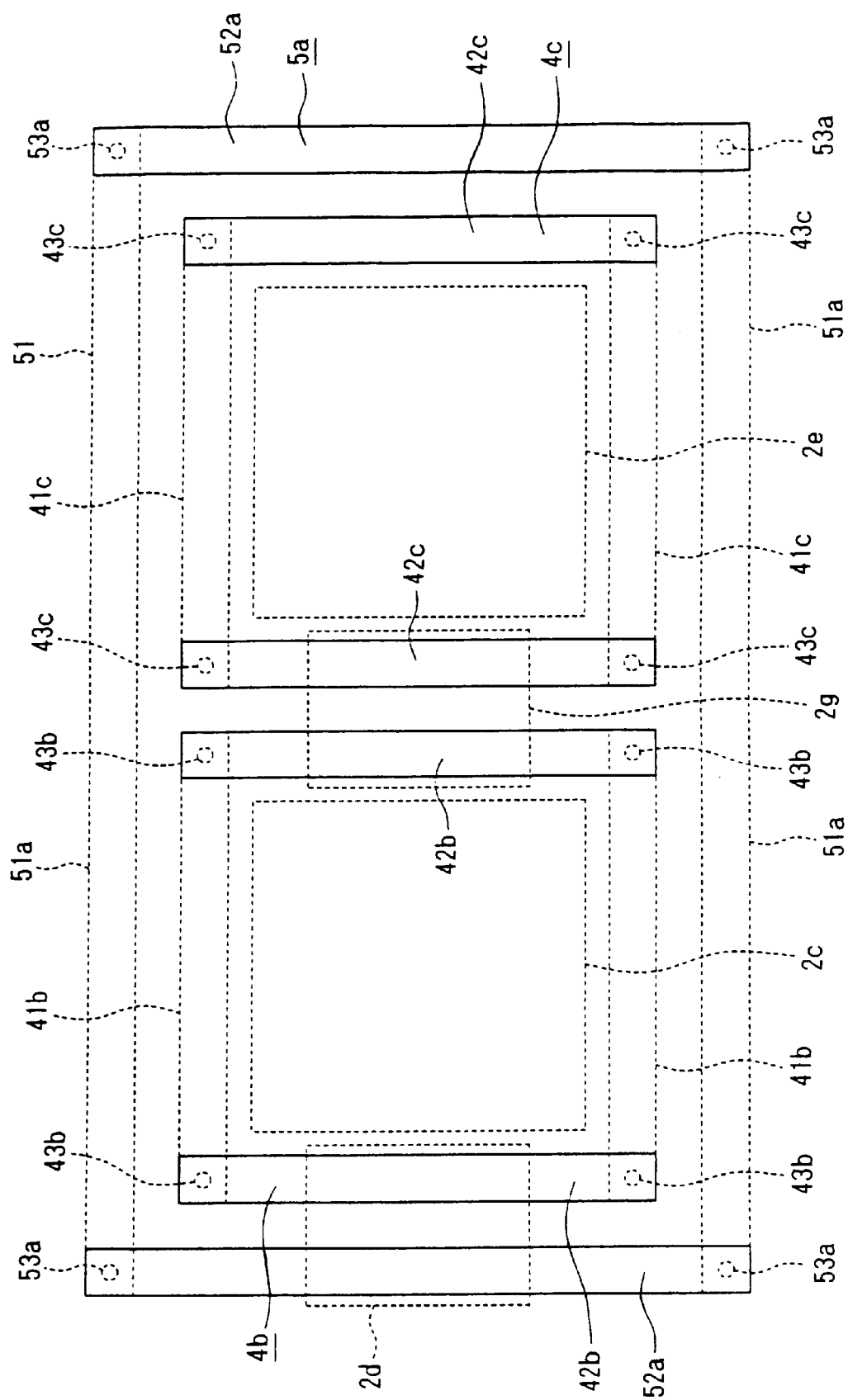
FIG. 5 is a plan view of a third embodiment of a semicustom IC according to the present invention.
Figure 6:
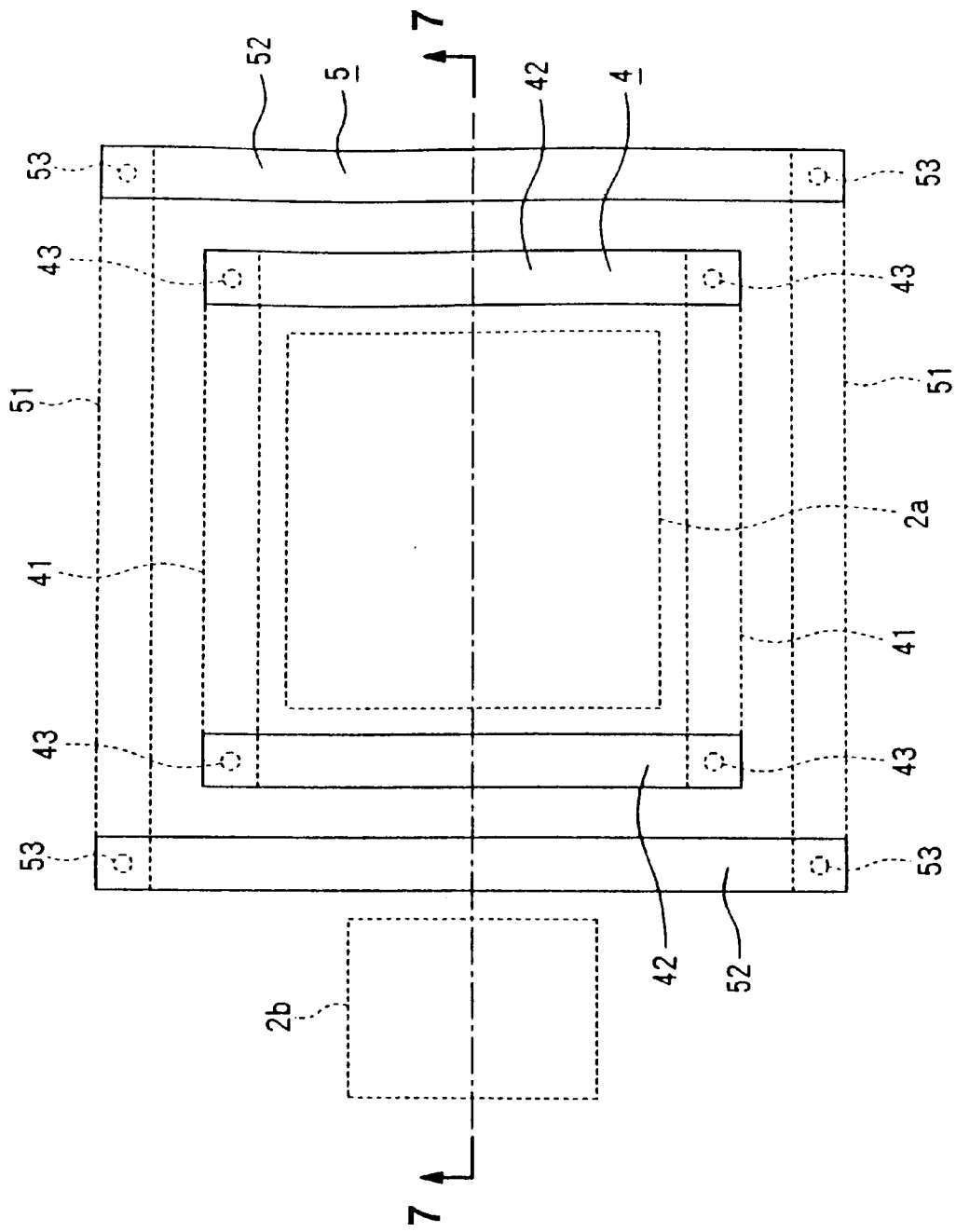
FIG. 6 is a plan view of a conventional semicustom IC.
Figure 7:
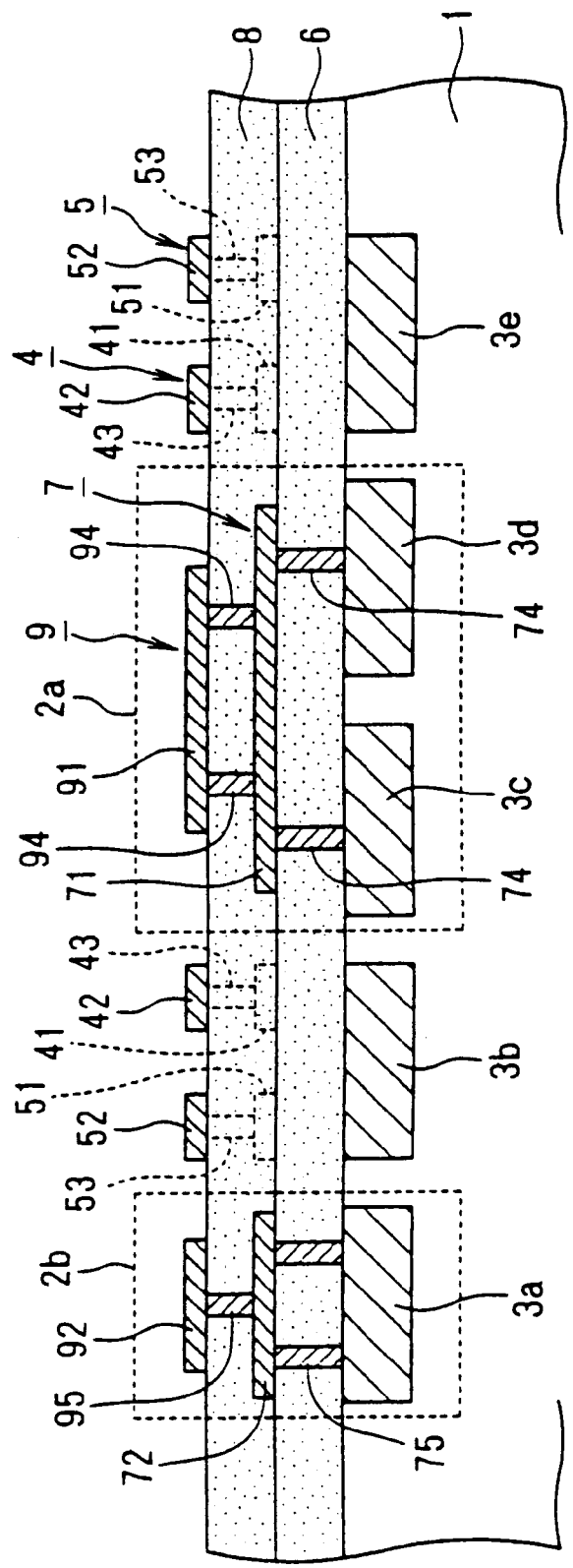
FIG. 7 is a cross-sectional view taken along line B—B of FIG. 3.

A third embodiment of a semicustom IC according to the present invention is described below with reference to FIG. 5. FIG. 5 is a plan view of the third embodiment.

The third embodiment of the semicustom IC is a modification of the second embodiment. As can be seen from FIG. 5, the difference from the second embodiment is that, to supply a specific voltage to a first macrocell 2c and a third macrocell 2e, ring-shaped power supply lines 4b and 4c with a specific width and thickness are separately formed around the first macrocell 2c and the third macrocell 2e, respectively, and a power supply line 5a for common use by both the first macrocell 2c and the third macrocell 2e is formed along a perimeter surrounding both power supply lines 4b and 4c. Herein, the power supply line 5a corresponding to the power supply line 5a in the second embodiment.

Furthermore, in this third embodiment of the semicustom IC, a fifth macrocell 2g corresponding to the fourth macrocell 2f is formed below the power supply lines 4b and 4c and between the first macrocell 2c and the third macrocell 2e.

The structures of power supply lines 4b and 4c are described below with reference to FIG. 5.

The power supply line 4b includes an interconnection conductor 41b formed in a third interconnection layer (not shown) and an interconnection conductor 42b formed in a fourth interconnection layer (not shown), wherein the interconnection conductor 41b and the interconnection conductor 42b are connected to each other via a connecting conductor 43b such that a closed circuit is formed. Similarly, the power supply line 4c includes an interconnection conductor 41c formed in the third interconnection layer (not shown) and an interconnection conductor 42c formed in the fourth interconnection layer (not shown), wherein the interconnection conductor 41c and the interconnection conductor 42c are connected to each other via a connecting conductor 43c such that a closed circuit is formed.

The other parts of this third embodiment are the same as those of the second embodiment, and thus they are not described in further detail herein.

In the third embodiment constructed in the above-described manner, the first macrocell 2c may be used to form, for example, a CPU, the second macrocell 2d may be used to form an interface circuit for interfacing the CPU with another analog circuit (not shown), the third macrocell 2e may be used to form a memory, and the fifth macrocell 2g may be used to form an interface circuit for interfacing the memory with the CPU, wherein the CPU and the memory can be connected via interconnection lines with reduced lengths thereby allowing data to be read and written at an increased speed.

As described above, the third embodiment of the semicustom IC has advantages substantially similar to those obtained in the second embodiment.

INDUSTRIAL APPLICABILITY

According to the present invention, as described above, the second macrocell can be formed using the basic cell at the location closest to the first macrocell, and thus the basic cells can be used in an efficient manner, and the total size can be reduced.

Furthermore, according to the present invention, a macrocell can be formed using a basic cell at the location closest to the macrocell surrounded by the power supply line, and thus the basic cells can be used in an efficient manner, and the total size can be reduced.

What is claimed is:

1. A semicustom IC comprising:

a plurality of basic cells disposed on a semiconductor substrate;

a plurality of macrocells formed using said plurality of basic cells and a plurality of interconnection layers, wherein at least two macrocells of said plurality of macrocells are formed using particular basic cells of said plurality of basic cells and using at least one interconnection layer of said plurality of interconnection layers disposed over said particular basic cells;

a first power supply line for supplying power to one macrocell of said at least two macrocells is formed around said one macrocell using an upper interconnection layer of said plurality of interconnection layers;

a second power supply line for supplying power to another macrocell of said at least two macrocells is formed around said another macrocell using said upper interconnection layer of said plurality of interconnection layers; and the remaining macrocells of said plurality of macrocells are formed using basic cells located directly below at least one of said first power supply line and said second power supply line and also using a lower interconnection layer of said plurality of interconnection layers.

2. The semicustom IC according to claim 1, wherein said plurality of interconnection layers include three or more interconnection layers.

3. The semicustom IC according to claim 1, wherein said plurality of interconnection layers include a total of four interconnection layers and wherein said first power supply line and said second power supply line are formed using a third interconnection layer and a fourth interconnection layer of said total of four interconnection layers.

4. The semicustom IC according to claim 1, wherein said remaining macrocells of said plurality of macrocells are interface circuits disposed between circuits formed in said at least two macrocells and other circuits.

5. The semicustom IC according to claim 1, wherein said at least two macrocells form memories and said remaining macrocells form battery backup circuits for maintaining the contents of said memories.

6. The semicustom IC according to claim 1, wherein said first power supply line and said second power supply line are formed such that said first power supply line and said second power supply line are used in common by more than one macrocell of said plurality of macrocells.

* * * * *